United States Patent
Sei et al.

[19]

[11] Patent Number: 5,945,188
[45] Date of Patent: Aug. 31, 1999

[54] ADHESIVE TAPE FOR TAPE AUTOMATED BONDING

[75] Inventors: Akinori Sei; Yoshikazu Tsukamoto; Takashi Shiozawa; Tadahiro Ohishi; Hitoshi Narushima, all of Shizuoka, Japan

[73] Assignee: Tomoegawa Paper Co., Ltd., Tokyo, Japan

[21] Appl. No.: 08/967,901

[22] Filed: Nov. 12, 1997

Related U.S. Application Data

[62] Division of application No. 08/612,264, Mar. 7, 1996, Pat. No. 5,843,550, which is a division of application No. 08/216,432, Mar. 23, 1994, Pat. No. 5,523,137, which is a division of application No. 07/917,345, Jul. 23, 1992, abandoned.

[30] Foreign Application Priority Data

| Jul. 24, 1991 | [JP] | Japan | 3-206115 |
| Jul. 24, 1991 | [JP] | Japan | 3-206116 |
| Mar. 11, 1992 | [JP] | Japan | 4-86552 |
| Apr. 10, 1992 | [JP] | Japan | 4-116670 |

[51] Int. Cl.$^6$ ............ B32B 27/34; C09J 7/02
[52] U.S. Cl. ............ 428/41.7; 428/344; 428/354; 428/355 EP; 428/355 CN; 428/474.4
[58] Field of Search ............ 428/41.7, 344, 428/349, 354, 355 EP, 474.4, 355 EN, 355 CN

[56] References Cited

U.S. PATENT DOCUMENTS

| 4,070,225 | 1/1978 | Batdorf | 428/413 |
| 4,082,708 | 4/1978 | Mehta | 428/413 |
| 4,171,404 | 10/1979 | Carroll | 428/413 |
| 4,273,916 | 6/1981 | Jones | 528/117 |
| 4,707,388 | 11/1987 | Park et al. | 428/36 |
| 4,816,426 | 3/1989 | Bridges et al. | 437/207 |
| 5,001,542 | 3/1991 | Tsukagoshi et al. | 357/68 |
| 5,174,766 | 12/1992 | Yoshizawa et al. | 439/91 |
| 5,290,614 | 3/1994 | Narushima et al. | 428/40 |
| 5,523,137 | 6/1996 | Sei et al. | 428/41.7 |

FOREIGN PATENT DOCUMENTS

| 53-134365 | 11/1978 | Japan . |
| 56-152832 | 11/1981 | Japan . |
| 2-15644 | 7/1988 | Japan . |

*Primary Examiner*—Blaine R. Copenheaver
*Attorney, Agent, or Firm*—Wenderoth, Lind & Ponack, L.L.P.

[57] ABSTRACT

An adhesive tape for TAB having an organic insulating film, an adhesive layer formed on the organic insulating film and a protection layer formed on the adhesive layer, the adhesive layer being any one of a layer containing a polyamide resin having an amine value of at least 3 and an epoxy resin, a layer containing a polyamide resin and a powdery inorganic filler, a layer containing an epoxy resin having a siloxane structure in its main chain, and a layer containing at least one maleimide compound.

6 Claims, 1 Drawing Sheet

ADHESIVE TAPE FOR TAPE AUTOMATED BONDING

This application is a division of application Ser. No. 08/612,264, filed Mar. 7, 1996, (now U.S. Pat. No. 5,843,550), which is a division of application Ser. No. 08/216,432, filed Mar. 23, 1994 (now U.S. Pat. No. 5,523,137), which application is a division of now abandoned application Ser. No. 07/917,345, filed Jul. 23, 1992.

FIELD OF THE INVENTION

The present invention relates to an adhesive tape for tape automated bonding (hereinafter referred to as TAB). The adhesive tape for TAB is processed into a TAB tape for use in a process for manufacturing semiconductor devices, in particular, those devices which require low dimensional changes to suit high-pin count and fine patterned devices.

PRIOR ART

Heretofore, adhesive tapes for TAB have been processed into TAB tapes by the method which comprises the following steps:

(1) punching the adhesive tape for TAB by stamping means to make sprocket and device holes and removing a protective film from the punched tape, (2) attaching copper foil on the removed portion of the punched tape by a thermocompression bonder and heating the copper-foil laminated tape to harden an adhesive therein, (3) coating a photoresist on the copper-foil laminated tape, irradiating the photoresist with UV or the like through a mask, and developing the photoresist with a developer, (4) backing the device hole, etching the copper, eliminating the resist, de-backing the device hole, coating a solder resist on the copper foil-laminated tape, and making a circuit on the copper-foil laminated tape, and (5) plating tin or gold on the tape to obtain a TAB tape.

A semiconductor chip is inner-lead bonded to the above-obtained TAB tape, leads are cut (trimmed), and the assembly of the chip and the TAB tape is outer-lead bonded to a substrate, etc., and sealed with a resin. Alternatively, after the assembly is inner-lead bonded to the TAB tape, the assembly is sealed with a resin, then the leads including leads for peripheral circuits are cut (trimmed), and the assembly is outer-lead bonded to a substrate.

Positioned between copper foil as a metal and an organic insulating film, an adhesive used in an adhesive tape for TAB is required to have high adhesion strength to both the copper foil and the organic insulating film. Conventional adhesive tape for TAB have the following defects. a) The adhesive shows a decrease in the adhesion strength to a copper foil since the adhesive layer is exposed to alkalis (e.g., potassium ion at a gold plating time or at resist peeling time), acids (e.g., chloride ion or sulfate ion at a tin plating time) and an etching solution (containing chloride ion) in the above steps. b) The insulation reliability decreases since the above alkalis and acids are absorbed into, and stored in, the adhesive layer. c) The adhesion strength of the adhesive to the copper foil and organic insulating film decreases at a high temperature when the above inner lead bonding and outer lead bonding are carried out. d) A copper foil pattern sinks into the adhesive layer during the above bonding procedures, the tape thickness becomes nonuniform. As a result, with an advance in the device density and an increase in the number of input and output terminals, there arise problems of bonding failure in a multi-terminal device, lead deformation and peeling.

The adhesive layer and organic insulating film of the adhesive tape for TAB are often allowed to remain in a peripheral circuit and a sealing resin. In this case, with an advance in the device density, there arises a problem of ionic impurities which affect the copper foil interpattern insulation reliability and corrode an Al circuit. The ionic impurities are derived mainly from the adhesive. That is, the ionic impurities are formed since the adhesive layer is exposed to alkalis, acids and an etching solution in the above steps 3) to 5), or they are contained in the adhesive per se. The insulation reliability is affected by the resistance of the adhesive to moist heat, the electric resistance of the adhesive and the above ionic impurities.

Conventional adhesives used in adhesive tapes for TAB are epoxy-containing adhesives. These adhesives cause a problem of insulation deterioration, including inter-lead migration of a metal in a lead pattern, due to the following properties which the adhesives have. That is, (a) the adhesives are liable to absorb ionic impurities (particularly chloride ion) when the tape is processed, (b) the adhesives are liable to be hydrolyzed due to moist heat, and (c) the adhesives have low electric resistance.

SUMMARY OF THE INVENTION

It is an object of the present invention to provide an adhesive tape for TAB which is excellent in chemical resistance and heat resistance in an implementation process and which has high adhesion strength.

It is another object of the present invention to provide an adhesive tape for TAB which is almost free from insulation deterioration and almost free from corrosive action.

According to the present invention, there is provided an adhesive tape for TAB having an organic insulating film, an adhesive layer formed on the insulating film and a protection layer formed on the adhesive layer, the adhesive layer being any one of a layer containing a polyamide resin having an amine value of at least 3 and an epoxy resin, a layer containing a polyamide resin and a powdery inorganic filler, a layer containing an epoxy resin having a siloxane structure in its main chain, and a layer containing a maleimide resin.

DETAILED DESCRIPTION OF THE INVENTION

Figure 1:
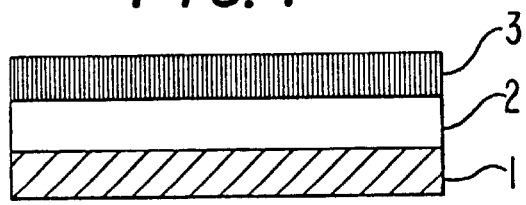
FIG. 1 is a schematic cross-sectional view of an adhesive tape for TAB according to the present invention.

FIG. 1 schematically show the cross section of a tape of the present invention, in which a thermosetting, semi-cured adhesive layer 2 is formed on an organic insulating film 1, and a protection film 3 as a protection layer is formed on the adhesive layer 2. The adhesive layer 2 in FIG. 2 has a one-layer structure, while it may have a multi-layer structure.

The organic insulating film has a thickness of 25 to 188 μm, preferably 50 to 125 μm. The organic insulating film is selected from a heat-resistant film formed of polyimide, polyetherimide, polyphenylenesulfide or polyether ether ketone, and a composite heat-resistant film formed of an epoxy resin and a glass cloth, or an epoxy resin, polyimide and a glass cloth.

The adhesive layer is thermosetting, and is required to be in a semi-cured state. The adhesive layer is formed of at least one layer. The thickness of the adhesive layer is in the range of from 5 to 50 μm, preferably in the range of from 15 to 30 μm.

The adhesive layer is in contact with the organic insulating film. Therefore, the adhesive layer is required to have high adhesion strength to the organic insulating film even at a high temperature, high adhesion strength to a copper foil and excellent chemical resistance to chemicals to which the adhesion layer is exposed when it is processed to form a TAB tape.

To satisfy the above requirements, the present invention (to be referred to as the present invention 1 hereinafter) provides an adhesive tape for TAB having an organic insulating film, an adhesive layer formed on the organic insulating film and a protection layer formed on the adhesive layer, in which the adhesive layer contains a polyamide resin having an amine value of at least 3 and an epoxy resin. The polyamide resin is incorporated in order to achieve the adhesion of the adhesive layer to the organic insulating film and flexibility. In the present invention 1, the amine value of the polyamide resin is required to be at least 3, and it is preferably 5 to 50. When the polyamide resin has a high amine value, the reactivity and affinity of the polyamide resin with the epoxy resin co-present in the adhesive are improved. As a result, the cured adhesive layer shows improved adhesion strength, improved chemical resistance and improved heat resistance. When the above amine value is less than 3, the reactivity of the polyamide resin with the epoxy resin is too low. As a result, there is no effect on the improvement in the adhesion strength to the organic insulating film and a copper foil, and the resultant tape fails to satisfy the chemical resistance required for etching and plating and the heat resistance required for bonding.

The amine value of the polyamide resin refers to a milligram weight of KOH equivalent to the weight of an amine alkali present in 1 g of a polyamide resin sample. It is obtained by dissolving a polyamide resin in a toluene/n-butanol (1/1) mixed solvent and neutralization-titrating the so-prepared mixture with a 0.5N hydrochloric acid aqueous solution as a titration liquid in the presence of an indicator.

The polyamide resin used in the present invention 1 is selected from aliphatic polyamides and aromatic polyamides having a weight average molecular weight of 2,000 to 150,000 and a softening temperature of 50 to 180° C.

The epoxy resin used in combination with the polyamide resin reacts with a terminal of the molecular chain of the polyamide resin to improve the heat resistance and chemical resistance. The epoxy resin is used in an amount of 9 to 88 parts by weight per 100 parts by weight of the polyamide resin.

In the present invention 1, the adhesive layer preferably contains an imidazole compound in addition to the epoxy resin. The epoxy resin easily reacts under the action of the imidazole compound to further improve the heat resistance and chemical resistance.

The adhesive layer in the present invention 1 may further contain a phenolic resin. The phenolic resin is incorporated preferably in an amount of 5 to 60 parts by weight per 100 parts by weight of the polyamide resin. Further, the adhesive layer may additionally contain a polyester resin and thermoplastic resins such as acrylonitrile-butadiene rubber (hereinafter referred to as NBR) and styrene-butadlene rubber (hereinafter referred to as SBR).

As a first variant, the present invention (to be referred to as the present invention 2 hereinafter) provides an adhesive tape for TAB having an organic insulating film, a thermosetting adhesive layer composed mainly of a polyamide resin and formed on the organic insulating film, and a protection layer formed on the adhesive layer, in which the adhesive layer contains at least one powdery inorganic filler.

Figure 3:
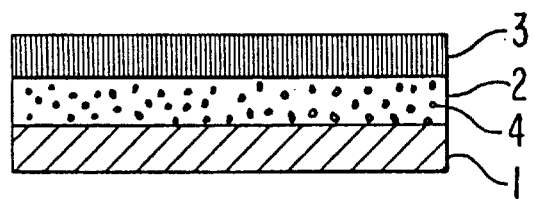
FIG. 3 is a schematic cross-sectional view of another adhesive tape for TAB according to the present invention.

FIG. 3 shows the schematic cross-sectional view of an adhesive tape for TAB according to the present invention 2, in which a semi-cured adhesive layer 2 containing a powdery inorganic filler 4 is formed on one surface of an organic insulating film 1, and a protection film 3 is formed on the adhesive layer. In the present invention 2, the adhesive layer is composed mainly of a polyamide resin and contains at least one powdery inorganic filler. In order to impart the tape with chemical resistance, it is preferred to incorporate a phenolic resin and an epoxy resin as a thermosetting component into the adhesive layer. When an epoxy resin is incorporated, it is preferred to use an accelerator such as an imidazole compound in combination. Further, the adhesive layer may further contain a polyester resin and thermoplastic resins such as NBR and SBR.

The powdery inorganic filler used in the present invention 2 works to inhibit the thermal expansion and contraction of the adhesive layer. The powdery inorganic filler is selected from stable oxides such as powdered silica, alumina, diatomaceous earth, titanium oxide, zinc oxide and magnesium oxide, and other inorganic pigments. The powdery inorganic filler preferably has an average particle size of 0.1 to 30 μm. The average particle size is obtained by measurement using a light transmitting particle size analyzer.

In the present invention 2, the amount of the polyamide resin based on the total solid content of the adhesive layer is preferably 7 to 80% by weight. When this amount is less than 7% by weight, the adhesive is liable to ooze out of a line formed between the adhesive layer and the copper foil and out of a device hole. When the above amount exceeds 80% by weight, the adhesion strength to the copper foil decreases. The content of the powder inorganic filler in the adhesive layer is 1 to 90% by weight, particularly preferably 3 to 50% by weight. When this content exceeds 90% by weight, the adhesive layer sometimes shows insufficient adhesion strength to a copper foil when the copper foil is bonded to the holed tape under heat and pressure. In some cases, the adhesive per se turns opaque to impair the visibility through the tape in positioning when the bonding is carried out. When the above content is less than 1% by weight, no sufficient effect of the powdery inorganic filler can be expected.

In the present invention 2, when the adhesive layer is formed of two layers or more, the layer in contact with the protection film is required to contain the powdery inorganic filler.

The polyamide resin used as a main component of the adhesive layer is selected from a variety of known polyamide resins. The molecular weight of the polyamide resin has something to do with flexibility and melting properties (oozing of the adhesive out of a device hole) when the adhesive layer is bonded to a copper foil under heat and pressure and when the adhesive is cured. When the molecular weight of the polyamide resin is too low, the melting temperature is too low and the problem of the adhesive oozing occurs. When this molecular weight is too high, too high a temperature is required to bond the adhesive layer to a copper foil under pressure. In the present invention 2, preferred is a polyamide resin having a weight average molecular weight of 30,000 to 150,000 and a softening point of 100 to 180° C.

Further, the molecular weight distribution of the polyamide resin is one factor having some influence on the melting properties concerning the adhesive oozing. When the molecular weight distribution is narrow, the viscosity of the adhesive rapidly decreases under heat, and the temperature range is narrow at which no adhesive oozes out during the bonding under heat and pressure. Therefore, it is preferred to use a polyamide resin having a broad molecular weight distribution, i.e., a polyamide resin having a weight average molecular weight/number average molecular weight ratio of 2 to 50.

When an polyamide resin having an amide group equivalent (molecular weight/one amide group) of 200 to 400 is used, the moisture absorption properties of the adhesive layer decrease, and a decrease in electric resistance due to moisture absorption can be prevented to the extent that the degree of the decrease is one digit. Further, the humidity resistance including resistance to hydrolysis is improved. As a result, the insulation deterioration can be particularly preferably prevented.

There may be used a polyamide resin consisting of molecules in which the hydrocarbons each between amide groups have a molecular weight in a wide range of from 100 to 800, and a polyamide resin in which the hydrocarbons having different molecular weights each between amide groups are irregularly arranged. These polyamide resins are preferred, since they have adhesion capability and high flexibility in spite of their large amide group equivalent.

The adhesive layer may further contain a phenolic resin. The phenolic resin is incorporated in an amount of 5 to 60 parts by weight per 100 parts by weight of the polyamide resin. The adhesive layer may further contain an epoxy resin and an imidazole compound. The epoxy resin is incorporated in an amount of 9 to 88 parts by weight per 100 parts by weight of the polyamide resin. The imidazole compound is incorporated in an amount of 0.03 to 10 parts by weight per 100 parts by weight of the epoxy resin. The imidazole compound promotes the curing of the epoxy resin.

As a second variant, the present invention (to be referred to as the present invention 3 hereinafter) provides an adhesive tape for TAB having an organic insulating film, an adhesive layer formed on the organic insulating film, and a protection layer formed on the adhesive layer, in which the adhesive layer contains at least epoxy resin having a siloxane structure in its main chain.

The epoxy resin having a siloxane structure in the main chain is selected from a wide variety of known epoxy resins. Any epoxy resin having any structure can be used if its main chain is partly or wholly formed of a siloxane structure. The polymer constituting the main chain may have a structure of any one of a homopolymer, a random copolymer and a block copolymer. The siloxane structure contained in the main chain may be any one of a linear structure, a branched structure, a cyclic structure and a combination of at least two of these. The number of epoxy group(s) in per molecule of the epoxy resin is at least one, and it is not necessary to impose the upper limit on this number. In view of the compatibility of the epoxy resin with other resin and the enhancement of the crosslinking density of the cured adhesive, the number of the epoxy groups is preferably 3 or more.

The epoxy resin having a siloxane structure in the molecule, used in the present invention 3, can be obtained, for example, by polycondensing an organosilicon compound (detailed below) with an epoxy compound having at least 2 epoxy groups in the molecule.

The above organosilicon compound includes organoalkoxysilanes such as phenyltrimethoxysilane, diphenyldiethoxysilane, methyltripropoxysilane, phenylmethyldimethoxysilane, phenyldimethylmonomethoxysilane, dimethyldiethoxysilane and vinylmethyldimethoxysilane; silanes and siloxanes such as tris(phenylmethylmethoxysiloxy)phenylsilane, 1,5-dimethyl-1,3,5-triphenyl-1,3,5-trimethoxytrisiloxane, tris(phenylmethylmethoxysiloxy)vinylsilane and 1,3-dimethyl-1,3-diphenyl-1,3-dimethoxydisiloxane; and siloxanes having a molecular structure derived from the (co)hydrolysis of one or more of the above silanes and siloxanes and the polycondensation of the resultant (co)hydrolysis products and containing a hydroxyl group and/or an alkoxy group bonded to a silicon atom.

The above epoxy compound is required to contain at least 2 epoxy groups, and in addition to the epoxy groups, it may contain functional groups such as hydroxyl, alkoxy and vinyl groups.

Specifically, the above epoxy resin includes allyglycidyl ether, butylglycidyl ether, glycidyl methacrylate, 3,4-epoxy-6-methylcyclohexylmethyl-3,4-epoxy-6-methylcyclohexanecarboxylate, vinylcyclohexenecarboxylate, vinylcyclohexene dioxide, dipentene dioxide, dicyciopentadiene dioxide, bis(3,4-epoxy-6-methylcyclohexylmethyl)adipate, diglycidyl tetrahydrophthalate, diglycidyl hexahydrophthalate, diglycidyl phthalate, a phenol novolak epoxy resin, triglycidylisocyanurate, bisphenol A type resins such as bisphenol A diglycidyl ether obtained from bisphenol A and epichlorohydrin, an epoxidized cresol novolak resin, and epoxy compounds obtained by partially modifying the above epoxy compounds with a fatty acid. Further, there may be co-used other epoxy compounds having other structure such as epoxy resins modified by an elastomer such as NBR, SBR, Br and dimer acid.

The above epoxy resin having a siloxane structure may be allowed to react with a polybasic carboxylic acid or an acid anhydride thereof. Specific examples of the polybasic carboxylic acid and the acid anhydride thereof include phthalic anhydride, isophthalic acid, terephthalic acid, maleic anhydride, fumaric acid, succinic acid, sebacic acid, adipic acid and tetrahydrophthalic anhydride.

The above adhesive layer may contain a curing agent for curing the above epoxy resin having a siloxane structure. The curing agent includes a novolak phenolic resin, a resol phenolic resin, diaminodiphenylmethane, diaminodiphenylsulfone, a polyamide resin, aromatic polyamine, aliphatic polyamine and polyamideamine. These curing agents may be used alone or in combination. The curing agent is incorporated in an amount of 5 to 700 parts by weight per 100 parts by weight of the epoxy resin.

In the present invention 3, the adhesive layer may further contain an epoxy resin having no siloxane structure in combination with the epoxy resin having a siloxane structure. The epoxy resin having no siloxane structure is incorporated in an amount of approximately 10 to 16 parts by weight per 100 parts by weight of the epoxy resin having a siloxane structure. The proportion of the epoxy resin having a siloxane structure based on the total solid content of the adhesive layer is preferably 5 to 50% by weight, more preferably 10 to 20% by weight. When this proportion is less than 5% by weight, the water resistance of the adhesive layer decreases, and a decrease in the electric resistance due to the presence of water is liable to occur. When this proportion exceeds 50% by weight, undesirably, an excess portion of the epoxy resin having a siloxane structure, which takes no part in the curing, is migrated onto the adhesive layer surface to cause a decrease in the adhesion strength to a copper foil.

In the present invention 3, the adhesive layer may further contain at least one member selected from thermoplastic resins such as a polyamide resin, a polyester resin, NBR, SBR and a polyvinyl acetal resin to obtain a cured adhesive layer having flexibility. Of these thermoplastic resins, a polyamide resin is particularly preferred, since it not only gives a cured adhesive layer having flexibility but also works as a curing agent for the epoxy resin. The polyamide resin can be selected from a variety of known polyamide resins. Of known polyamide resins, preferred are those having an amine value of at least 3 (preferably 5 to 20), since these effectively work as a curing agent for the epoxy resin and improve the cured adhesive in adhesion strength, chemical resistance and heat resistance.

In the present invention 3, the polyamide resin is used in an amount of 100 parts by weight per 100 to 1,200. parts by weight of curing components such as the epoxy resin, phenolic resin, etc., in the adhesive layer.

In the present invention 3, it is preferred to incorporate an imidazole compound into the adhesive layer for acceleration of curing. The imidazole compound is incorporated in an amount of 0.03 to 10 parts by weight per 100 parts by weight of the epoxy compound.

In the present invention 3, when the adhesive layer has a layer structure formed of at least two layers, the epoxy resin having a siloxane structure in the molecule is required to be contained in the layer in contact with the protection layer.

As a third variant, the present invention (to be referred to as the present invention 4 hereinafter) provides an adhesive tape for TAB having an organic insulating film, an adhesive layer formed on the organic insulating film, and a protection layer formed on the adhesive layer, in which the adhesive layer contains at least one maleimide compound.

In the present invention 4, it is preferred to incorporate at least one of thermosetting components such as a phenolic resin and an epoxy resin into the adhesive layer in order to impart the adhesive layer with chemical resistance and heat resistance.

The maleimide compound used in the present invention includes a monomer having at least one maleimide group, a polymer obtained from the monomer, a polymer obtained from the monomer and a compound having an epoxy group, a polymer obtained from the monomer and a compound having an amide group, a product obtained by reacting the monomer with an epoxy resin and a product obtained by reacting the monomer with a polyamide resin. For example, the above monomer includes bismaleimide of the formula (1),

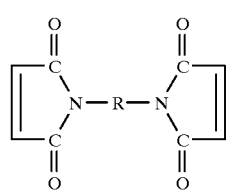

wherein R is a divalent aromatic group.

Examples of the above monomer include N,N'-m-phenylenebismalelmide, N,N'-p-phenylenebismaleimide, N,N'-m-toluylenebismaleimide, N,N'-p-toluylenebismaleimide, N,N'-4,4'-bisphenylenebismaleimide, N,N'-4,4'-[3,3'-dimethylbiphenylene]bismaleimide, N,N'-4,4'-[3,3'-dimethyldiphenylmethane]bismalemide, N,N'-4,4'-[3,3'-diethyldiphenylmethane]bismaleimide, N,N'-4,4'-diphenylmethanebismaleimide, N,N'-4,4'-diphenylpropanebismaleimide, N,N'-4,4'-diphenyletherbismaleimide, N,N'-3,3'-diphenylsulfonebismaleimide, and N,N'-4,4'-diphenylsulfonebismaleimide.

As the maleimide compound used in the present invention 4, for example, a novolak-like arranged maleimide resin of the following (2) formula can be used.

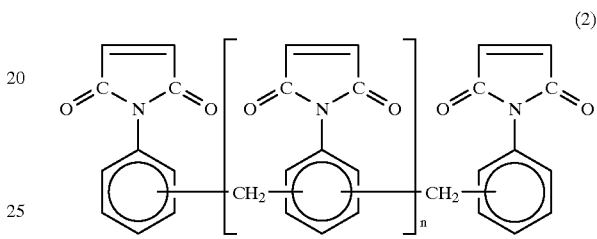

wherein n is an integer of at least 1.

Further, the maleimide compound used in the present invention can be selected from a maleimide resin having a siloxane structure and a maleimide resin having an aliphatic structure.

In the present invention 4, the above maleimide compounds may be used alone or in combination. When the adhesive layer contains the above thermosetting component, the maleimide compound is incorporated in an amount of 10 to 500 parts by weight per 100 parts by weight of the thermosetting component.

In the present invention 4, it is preferred to incorporate at least one of thermoplastic resins such as a polyamide resin, a polyester resin, NBR, SBR and a polyvinylacetal resin to obtain a cured adhesive layer having flexibility.

In the present invention 4, the polyamide resin is preferably used in an amount of 8 to 100 parts by weight per 100 parts by weight of the thermosetting components such as the epoxy resin and the phenolic resin in the adhesive layer. The content of the maleimide compound based on the total solid content in the adhesive layer is preferably 3 to 72% by weight, more preferably 5 to 20% by weight. When the maleimide compound content is less than 3% by weight, the heat resistance is liable to be insufficient. When this content exceeds 72% by weight, the flexibility of the adhesive layer decreases, and the formed adhesive layer is too hard to retain the form of the adhesive tape for TAB.

In the present invention 4, the adhesive layer preferably contains an imidazole compound for promoting the curing of the adhesive layer. The imidazole compound may be used in an amount of 0.03 to 10 parts by weight per 100 parts by weight of the epoxy resin.

In the present invention 4, the adhesive layer has a layer structure formed of at least one layer. When the adhesive layer has a layer structure of 2 or more layers, the maleimide resin is required to be contained in the layer in contact with the protection layer.

The epoxy resin used in each of the present inventions 1 to 4 is required to contain at least 2 epoxy groups in the molecule, and in addition to the epoxy groups, the epoxy resin may contain hydroxyl, alkoxy and vinyl groups.

Specific examples of the above epoxy resin include allyglycidyl ether, butylglycidyl ether, glycidyl methacrylate, 3,4-epoxy-6-methylcyclohexylmethyl-3,4-epoxy-6-methylcyclohexanecarboxylate, vinylcyclohexenecarboxylate, vinylcyclohexene dioxide, dipentene dioxide, dicyclopentadiene dioxide, bis(3,4-epoxy-6-methylcyclohexylmethyl)adipate, diglycidyl tetrahydrophthalate, a phenol novolak epoxy resin, triglycidylisocyanurate, bisphenol A type resins such as bisphenol A diglycidyl ether obtained from bisphenol A and epichlorohydrin, an epoxidized cresol novolak resin, and epoxy compounds obtained by partially modifying the above epoxy compounds with a resin acid. Further, there may be co-used other epoxy compounds having other structure such as epoxy resins modified by an elastomer such as NBR, SBR, Br and dimer acid.

Examples of the phenolic resin used in each of the present inventions 1 to 4 include bisphenol A type phenolic resins of which the phenol component is formed from bisphenol A, alkylphenol type phenolic resins of which the phenol component is formed from an alkyl phenol, resol type pheonolic resins obtained by co-polycondensing of these, and novolak type phenolic resins. These phenolic resins may be used alone or in combination. The resol type phenolic resins obtained by polycondensing of alkylphenols includes those of which the phenolic hydroxyl groups have methyl, ethyl, propyl, tert-butyl or nonyl in the o-position or p-position. These resol type phenolic resins are preferred since they react under heat to form insoluble and unmeltable solids, which improve the adhesive layer in adhesion strength, insulation reliability, chemical resistance and heat resistance.

The polyamide resin which is preferably used in the present inventions is selected from a variety of known polyamide resins. Particularly preferred is a polyamide resin having an amine value of at least 3.0 (preferably 5 to 20), since it effectively works as a curing agent for the epoxy resin and improves the cured adhesive in adhesion strength, chemical resistance and heat resistance. The polyamide resin used in the present inventions preferably includes aliphatic polyamides and aromatic polyamides having a weight average molecular weight of 2,000 to 150,000, a number average molecular weight of 500 to 8,000, a molecular weight distribution (weight average molecular weight (Mw)/ number average molecular weight (Mn)) of 2 to 50 and a softening point of 50 to 180° C. The above molecular weights (converted to a polystyrene basis) are measured by GPC, and the above softening point, by a ring and ball measuring method.

The imidazole compound preferably used in the present inventions 1 to 4 includes 2-methylimidazole and 2-ethyl-4-methylimidazole which are soluble in generally used solvents typified by methyl ethyl ketone, and it also includes 2-phenyl-4-benzyl-5-hydroxymethylimidazole which is sparingly soluble in generally used solvents.

In each of the present inventions 1 to 4, the protection layer for the adhesive layer is a protection film of polyethylene, polyethylene terephthalate or polypropylene.

Figure 2:
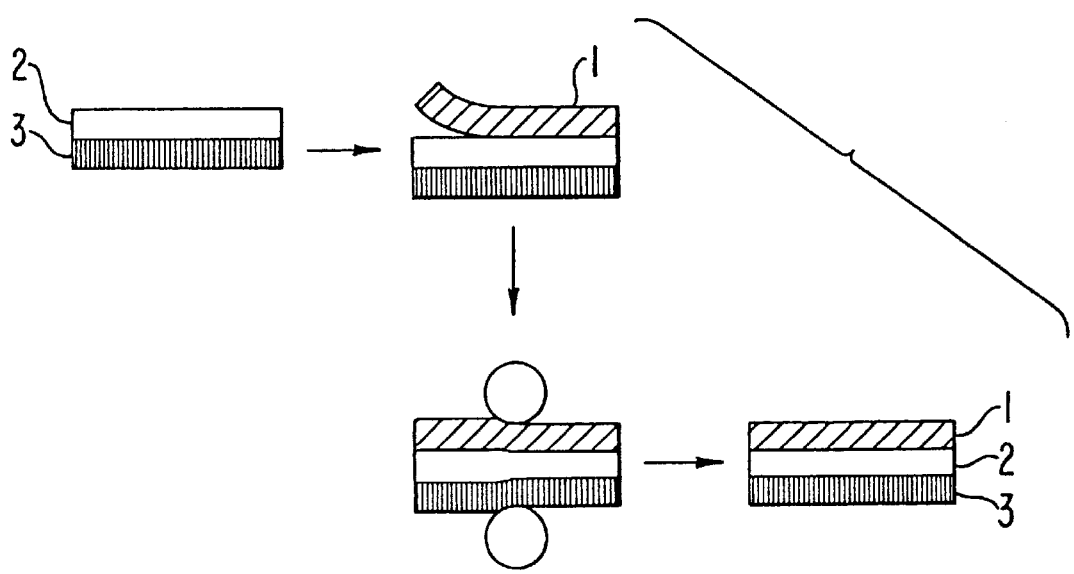
FIG. 2 is a chart showing the production of an adhesive tape for TAB according to the present invention.

In each of the present inventions 1 to 4, the adhesive tape for TAB is produced as follows. FIG. 2 shows production steps, in which an adhesive having a predetermined composition is applied onto a protection film 3 such that the dried layer thickness is 10 to 50 $\mu$m, preferably 15 to 30 $\mu$m. In this case, the adhesive layer is required to be semi-cured.

For this purpose, the applied adhesive is dried at 150 to 180° C. for 2 minutes. Then, an organic insulating film 1 is stacked on the so-prepared adhesive layer 2, and attached thereto under heat at 100 to 130° C. and pressure of at least 1 kg/cm$^2$. The resultant adhesive tape for TAB is taken around a roll. For example, the adhesive tape for TAB has a width of 30 to 200 mm and a length of 30 to 300 m.

In the adhesive tape for TAB according to the present invention 1, the adhesive layer contains at least the above polyamide resin and epoxy resin, and the polyamide resin has a terminal amine value of at least 3.0. Therefore, the adhesive layer does not show any decrease in the adhesion strength to a copper foil even if it is exposed to alkalis, acids or an etching solution in etching, plating and resist-peeling steps. Further, the adhesive layer does not show any decrease in the adhesion strength to a copper foil and the organic insulating film at a high temperature when the inner lead bonding and outer lead bonding are carried out.

In the adhesive tape for TAB according to the present invention 2, the adhesive layer contains the powdery inorganic filler. Therefore, the thermal expansion and contraction of the adhesive layer are inhibited, and the chemical resistance and heat resistance thereof are improved. As a result, the adhesive layer is hardly corroded by an etching solution and a plating solution used in a step of semiconductor device assembly, and the decrease in the adhesion strength of the adhesive layer to a copper foil can be prevented. The adhesive tape for TAB according to the present invention 2 has high insulation reliability and high adhesion strength. Therefore, a pattern having a line width which is decreasing with an increase in the number of lead pins and the organic insulating film can be securely bonded, and there arises no problem on inter-lead insulation properties. Therefore, that portion of the adhesive tape for TAB which is used for connection between a semiconductor chip and an outer electric circuit may remain in lead portions even if the number of the lead pins increases.

In the adhesive tape for TAB according to the present invention 3, the adhesive layer contains the epoxy resin having a siloxane structure in the main chain, and the siloxane structure gives excellent water repellency, which prevents a water-induced decrease in electric resistance. Due to the epoxy resin having a siloxane structure In the molecule contained in the adhesive layer, the cured adhesive layer does not show any decrease in the adhesion strength to a copper foil even when it is exposed to alkalis, acids or an etching solution in etching, plating and resist-peeling steps. Further, the adhesive layer does not show any decrease in the adhesion strength to a copper foil and the organic insulating film at a high temperature when the inner lead bonding and outer lead bonding are carried out.

In the adhesive tape for TAB according to the present invention 4, the adhesive layer contains the maleimide resin, and the structure of the maleimide resin characteristically gives excellent heat resistance. Further, the adhesive layer shows excellent resistance to chemicals such as acids and alkalis. Therefore, the adhesive layer of the adhesive tape for TAB according to the present invention 4 neither deteriorates in steps of etching, tin or gold plating, inner bonding, etc., nor causes the peeling of a copper foil and the organic insulating film at a high temperature. Further, due to the maleimide resin contained in the adhesive layer of the adhesive tape for TAB according to the present invention 4, the cured adhesive layer does not show any decrease in the adhesion strength to a copper foil even when it is exposed to alkalis, acids or an etching solution in etching, plating and resist-peeling. Further, since the maleimide resin structurally gives excellent heat resistance, the adhesive layer does not show any decrease in the adhesion strength to a copper foil and the organic insulating film at a high temperature when the inner lead bonding and outer lead bonding are carried out.

Therefore, the adhesive tape for TAB according to any one of the present inventions 1 to 4 can be applied to highly densified circuits. When devices having many input and output terminals are mounted, almost no bonding failure are caused, nor are leads deformed in carrying and bonding steps. The yields of devices therefore increase.

The present invention (inventions 1 to 4) will be explained hereinafter by reference to Examples, in which "part" stands for "part by weight".

EXAMPLE 1

A 38 μm thick protection film formed of a polyethylene terephthalate film was coated with an adhesive layer-forming coating composition containing the following components, and the resultant coating was dried at 160° C. for 2 minutes to form an adhesive layer having a thickness of 20 μm.

| | |
|---|---|
| Solution of 25% of a polyamide resin (Tohmide #509: amine value 7.0, weight average molecular weight 35,000, molecular weight distribution (Mw/Mn) 8.3, softening point 120° C., supplied by Fuji Kasei Kogyo K.K.) in an isopropyl alcohol/toluene mixed solvent | 400 parts |
| Epoxy resin (Epikote 828, supplied by Yuka Shell Epoxy K.K.) | 50 parts |
| Solution of 50% of a novolak phenolic resin (Tamanol 752, supplied by Arakawa Chemical Industries, Ltd.) in methyl ethyl ketone | 30 parts |
| Solution of 1% of 2-methylimidazole in methyl ethyl ketone | 0.3 part |

Then, a 50 μm thick organic insulating film formed of a polyimide film was stacked on the adhesive layer and bonded thereto at 130° C. under a pressure of 1 kg/cm².

Thereafter, the above protection film was peeled off, and a 1 oz/ft² electrolytic copper foil having a thickness of 35 to 40 μm was stacked on the adhesive layer and bonded thereto at 130° C. under a pressure of 1 kg/cm². Then, the so-prepared laminate was consecutively heated at 60° C. for 6 hours, at 80° C. for 6 hours and at 150° C. for 5 hours to cure the adhesive layer, whereby a cured-adhesive tape was obtained.

EXAMPLE 2

Example 1 was repeated except that the adhesive layer-forming coating composition was replaced with a coating composition containing the following components.

| | |
|---|---|
| Solution of 25% of a polyamide resin (Tohmide #1350: amine value 10.0, weight average molecular weight 37,000, molecular weight distribution (Mw/Mn) 6.7, softening point 152° C. supplied by Fuji Kasei Kogyo K.K.) in an isopropyl alcohol/toluene mixed solvent | 400 parts |
| Epoxy resin (Epikote 828, supplied by Yuka Shell Epoxy K.K.) | 50 parts |
| Solution of 50% of a novolak phenolic resin (Tamanol 752, supplied by Arakawa Chemical Industries, Ltd.) in methyl ethyl ketone | 30 parts |
| Solution of 1% of 2-methylimidazole in methyl ethyl ketone | 0.3 part |

Comparative Example 1

Example 1 was repeated except that the adhesive layer-forming coating composition was replaced with a coating composition containing the following components.

| | |
|---|---|
| Solution of 25% of a polyamide resin (Tohmide #394: amine value 2.0, supplied by Fuji Kasei Kogyo K.K.) in an isopropyl alcohol/toluene mixed solvent | 400 parts |
| Epoxy resin (Epikote 828, supplied by Yuka Shell Epoxy K.K.) | 50 parts |
| Solution of 50% of a novolak phenolic resin (Tamanol 752, supplied by Arakawa Chemical Industries, Ltd.) in methyl ethyl ketone | 30 parts |
| Solution of 1% of 2-methylimidazole in methyl ethyl ketone | 0.3 part |

(Test for evaluation of properties)

The cured-adhesive tapes obtained in Examples 1 and 2 and Comparative Example 1 were tested for evaluation of the following properties.

1) Chemical resistance

The above-obtained tapes were evaluated as below on the adhesion strength of the adhesive layer to the copper foil after immersion in an etching solution and an electroless tin plating solution.

Tape samples were subjected to etching (with an etching solution containing ferric chloride as a main component) to form copper patterns having a line width of 200 μm, 100 μm and 50 μm, and each sample was measured for adhesion strength of the adhesive layer to the copper pattern. Separately, tape samples were etched In the same manner as above, and electroless plated with tin, and each sample was measured for adhesion strength of the adhesive layer to the copper pattern. Table 1 shows the results. The values for adhesion strength shown in Table 1 were values for 180° peel strength obtained by means of a tension tester (Autograph AGS-100B, supplied by Shimadzu Corporation.

TABLE 1

| | Pattern width | 200 μm | 100 μm | 50 μm |
|---|---|---|---|---|
| Example 1 | After etching | 30.8 g | 14.7 g | 7.3 g |
| | After plating | 30.8 | 14.5 | 6.9 |
| Example 2 | After etching | 35.6 | 17.5 | 8.9 |
| | after plating | 35.9 | 17.5 | 8.0 |
| Comparative | After etching | 30.6 | 13.8 | 6.9 |
| Example 1 | After plating | 20.1 | 7.6 | 2.9 |

2) Adhesion under heat

A tape sample, on which a copper pattern having a width of 1 cm was formed, was fixed to a hot plate having a temperature of 350° C. such that the organic insulating film was attached to the hot plate. Then, the sample was measured for its peel strength by peeling the copper foil in the 180° direction at a peel rate of 5 cm/min. Table 2 shows the results.

TABLE 2

| | Peel strength (g/cm) |
|---|---|
| Example 1 | 290 |
| Example 2 | 340 |
| Comparative Example 1 | 70 |

Tables 1 and 2 clearly show that the adhesive tape for TAB, provided by the present invention, exhibits excellent chemical resistance and adhesion under heat.

EXAMPLE 3

A 38 μm thick protection film formed of a polyethylene terephthalate film was coated with an adhesive layer-forming coating composition containing the following components, and the resultant coating was dried at 160° C. for 2 minutes to form an adhesive layer having a thickness of 20 μm.

| | |
|---|---|
| Solution of 25% of a polyamide resin (Tohmide TXC-232-C, Mw = 57,000, Mw/Mn = 10.4, softening point 141° C., amine value 8.5, supplied by Fuji Kasei Kogyo K.K.) in an isopropyl alcohol/water mixed solvent | 70 parts |
| Epoxy resin (Epikote 828, supplied by Yuka Shell Epoxy K.K.) | 6 parts |
| Solution of 50% of a novolak phenolic resin (Tamanol 752, supplied by Arakawa Chemical Industries, Ltd.) in methyl ethyl ketone | 6 parts |
| Solution of 50% of a resol-type phenolic resin (CKM-1282, supplied by Showa Kobunshi K.K.) in methyl ethyl ketone | 4 parts |
| Alumina (UA-5105, average particle size 0.4 μm, supplied by Showa Denko K.K.) | 12 parts |

Then, a 50 μm thick organic insulating film formed of a polyimide film was stacked on the adhesive layer and bonded thereto at 130° C. under a pressure of 1 kg/cm$^2$.

Thereafter, the above protection film was peeled off, and a 1 oz/ft$^2$ electrolytic copper foil having a thickness of 35 to 40 μm was stacked on the adhesive layer and bonded thereto at 130° C. under a pressure of 1 kg/cm$^2$. Then, the so-prepared laminate was consecutively heated at 60° C. for 6 hours, at 80° C. for 6 hours, at 120° C. for 3 hours, and at 150° C for 5 hours to cure the adhesive layer, whereby a cured adhesive tape was obtained.

EXAMPLE 4

Example 3 was repeated except that the adhesive layer-forming coating composition was replaced with a coating composition containing the following components.

| | |
|---|---|
| Solution of 25% of a polyamide resin (Tohmide TXC-232-C, Mw = 57,000, Mw/Mn = 10.4, softening point 141° C., amine value 8.5, supplied by Fuji Kasei Kogyo K.K.) in an isopropyl alcohol/water mixed solvent | 70 parts |
| Epoxy resin (Epikote 828, supplied by Yuka Shell Epoxy K.K.) | 6 parts |
| Solution of 50% of a novolak phenolic resin (Tamanol 752, supplied by Arakawa Chemical Industries, Ltd.) in methyl ethyl ketone | 6 parts |
| Solution of 50% of a resol-type phenolic resin (CKM-1282, supplied by Showa Kobunshi K.K.) in methyl ethyl ketone | 4 parts |
| Solution of 1% of 2-ethylimidazole in methyl ethyl ketone | 7 parts |
| Silica (Nipsil E220, average particle size 1.5 μm, supplied by Nippon Silica Industrial Co., Ltd.) | 12 parts |

Comparative Example 2

Example 3 was repeated except that the adhesive layer-forming coating composition was replaced with a coating composition containing the following components.

| | |
|---|---|
| Solution of 25% of a polyamide resin (Tohmide TXC-232-C, supplied by Fuji Kasei Kogyo K.K.) in an isopropyl alcohol/water mixed solvent | 100 parts |
| Epoxy resin (Epikote 828, supplied by Yuka Shell Epoxy K.K.) | 8 parts |
| Solution of 50% of a novolak phenolic resin (Tamanol 752, supplied by Arakawa Chemical Industries, Ltd.) in methyl ethyl ketone | 8 parts |
| Solution of 50% of a resol-type phenolic resin (CKM-1282, supplied by Showa Highpolymer Co., Ltd.) in methyl ethyl ketone | 6 parts |
| Solution of 1% of 2-ethylimidazole in methyl ethyl ketone | 10 parts |

The cured adhesive tapes obtained in Examples 3 and 4 and Comparative Example 2 were subjected to the following tests on their properties.

1) A pattern having a interpattern line interval of 100 Am was placed under conditions where the temperature was 121° C., the pressure was 2 atm., and the applied voltage was 100 V, and measured for a time until an insulation failure occurred.

2) Chemical resistance (weight loss in acetone and methanol): An adhesive layer-forming coating composition was cured under heat, and immersed in acetone or methanol at 30° C. for 1 hour under the application of ultrasonic wave. Then, a weight loss (%) of the coating composition was determined.

3) A TAB tape was measured for adhesion strength of the adhesive layer to a copper foil at room temperature (100 μm wide, peel direction at 90°).

4) A TAB tape was measured for adhesion strength of the adhesive layer to a copper foil at a high temperature (250° C., 100 μm wide, peel direction at 90°).

TABLE 3

| | Example 3 | Example 4 | Comparative Example 2 |
|---|---|---|---|
| 1. Time (hr) until occurrence of insulation failure | 385 | 421 | 217 |
| 2. Chemical resistance: | | | |
| to acetone (%) | 1.7 | 1.7 | 2.0 |
| to methanol (%) | 2.1 | 1.9 | 2.3 |
| 3. Adhesion strength at room temperature (kg/cm) | 1.7 | 1.6 | 1.4 |
| 4. Adhesion strength at 250° C. (kg/cm) | 1.2 | 1.1 | 0.8 |

Table 3 clearly shows that the adhesive tape for TAB, provided by the present invention, exhibits high insulation reliability and excellent chemical resistance, and has high adhesion strength both at room temperature and at a high temperature.

EXAMPLE 5

A 38 μm thick protection film formed of a polyethylene terephthalate film was coated with an adhesive layer-forming coating composition containing the following components, and the resultant coating was dried at 160° C. for 2 minutes to form an adhesive layer having a thickness of 20 μm.

| | |
|---|---|
| Solution of 25% of a polyamide resin (Tohmide TXC-232-C, supplied by Fuji Kasei Kogyo K.K.) in an isopropyl alcohol/water mixed solvent | 50 parts |

-continued

| | |
|---|---|
| Epoxy resin having a siloxane structure (FM-5501, diglycidyl polysiioxane resin of which the main chain was entirely formed of a siloxane structure, supplied by Chisso Corporation) | 15 parts |
| Solution of 50% of a novolak phenolic resin (Tamanol 752, supplied by Arakawa Chemical Industries, Ltd.) in methyl ethyl ketone | 15 parts |
| Solution of 1% of 2-ethylimidazole in methyl ethyl ketone | 15 parts |

Then, a 50 μm thick organic insulating film formed of a polyimide film was stacked on the adhesive layer and bonded thereto at 130° C. under a pressure of 1 kg/cm².

Thereafter, the above protection film was peeled off, and a 1 oz/ft² electrolytic copper foil having a thickness of 35 to 40 μm was stacked on the adhesive layer. Then, the so-prepared laminate was consecutively heated at 60° C. for 6 hours, at 80° C. for 6 hours, and at 150° C. for 5 hours to cure the adhesive layer, whereby a cured adhesive tape was obtained.

EXAMPLE 6

Example 5 was repeated except that the adhesive layer-forming coating composition was replaced with a coating composition containing the following components.

| | |
|---|---|
| Solution of 25% of a polyamide resin (Tohmide TXC-232-C, supplied by Fuji Kasei Kogyo K.K.) in an isopropyl alcohol/water mixed solvent | 50 parts |
| Epoxy resin having a siloxane structure (KF-101, linear polyglycidyl polysiloxane resin of which the main chain was entirely formed of a siloxane structure, supplied by Shin-Etsu Chemical Co., Ltd.) | 15 parts |
| Solution of 50% of a novolak phenolic resin (Tamanol 752, supplied by Arakawa Chemical Industries, Ltd.) in methyl ethyl ketone | 15 parts |
| Solution of 1% of 2-ethylimidazole in methyl ethyl ketone | 15 parts |

Comparative Example 3

Example 5 was repeated except that the adhesive layer-forming coating composition was replaced with a coating composition containing the following components.

| | |
|---|---|
| Solution of 25% of a polyamide resin (Tohmide TXC-232-C, supplied by Fuji Kasei Kogyo K.K.) in an isopropyl alcohol/water mixed solvent | 50 parts |
| Epoxy resin (Epikote 828, supplied by Yuka Shell Epoxy K.K.) | 15 parts |
| Solution of 50% of a novolak phenolic resin (Tamanol 752, supplied by Arakawa Chemical Industries, Ltd.) in methyl ethyl ketone | 15 parts |
| Solution of 1% of 2-ethylimidazole in methyl ethyl ketone | 15 parts |

(Test on chemical resistance)

The cured adhesive tapes obtained in Examples 5 and 6 and Comparative Example 3 were tested for evaluation of the following properties.

1) Chemical resistance

The above-obtained adhesive tapes were evaluated as below on the adhesion strength of the adhesive layer to the copper foil after immersion in an etching solution and an electroless tin plating solution.

Tape samples were subjected to etching (with an etching solution containing ferric chloride as a main component) to form copper patterns having a line width of 100 μm, 50 μm and 30 μm, and each sample was measured for adhesion strength of the adhesive layer to the copper pattern. Separately, tape samples were etched in the same manner as above, and electroless plated with tin, and each sample was measured for adhesion strength of the adhesive layer to the copper pattern. Table 4 shows the results. The values for adhesion strength shown in Table 4 were values for 90° peel strength obtained by means of a tension tester (Autograph AGS-100B, supplied by Shimadzu Corporation).

TABLE 4

| | Pattern width | 100 μm | 50 μm | 35 μm |
|---|---|---|---|---|
| Example 5 | After etching | 16.5 g | 8.7 g | 4.3 g |
| | After plating | 15.9 | 6.9 | 3.5 |
| Example 6 | After etching | 15.6 | 7.2 | 3.8 |
| | after plating | 15.1 | 6.5 | 3.1 |
| Comparative Example 3 | After etching | 9.7 | 5.3 | 2.5 |
| | After plating | 8.6 | 4.6 | 1.9 |

2) Adhesion under heat

A tape sample, on which a copper pattern having a width of 1 cm was formed, was fixed to a hot plate having a temperature of 300° C. such that the organic insulating film was attached to the hot plate. Then, the sample was measured for its peel strength by peeling the copper foil in the 90° direction at a peel rate of 5 cm/min. Table 5 shows the results.

TABLE 5

| | Peel strength (g/cm) |
|---|---|
| Example 5 | 205 |
| Example 6 | 180 |
| Comparative Example 3 | 90 |

Table 5 clearly shows that the adhesive tape for TAB, provided by the present invention, exhibits excellent chemical resistance and excellent adhesion under heat.

EXAMPLE 7

A 38 μm thick protection film formed of a polyethylene terephthalate film was coated with an adhesive layer-forming coating composition containing the following components, and the resultant coating was dried at 160° C. for 2 minutes to form an adhesive layer having a thickness of 20 μm.

| | |
|---|---|
| Solution of 25% of a polyamide resin (Tohmide TXC-232-C, supplied by Fuji Kasei Kogyo K.K.) in an isopropyl alcohol/water mixed solvent | 50 parts |
| Solution of 20% of a maleimide compound (N,N'-4,4'-diphenylmethanebismaleimide, BMI-S, supplied by Mitsui Toatsu Chemicals, Inc.) in dimethylacetamide | 15 parts |
| Epoxy resin (Epikote 828, supplied by Yuka Shell Epoxy K.K.) | 13 parts |
| Solution of 50% of a novolak phenolic resin (Tamanol 752, supplied by Arakawa Chemical Industries, Ltd.) in methyl ethyl ketone | 13 parts |
| Solution of 1% of 2-ethylimidazole in methyl ethyl ketone | 15 parts |

Then, a 50 μm thick organic insulating film formed of a polyimide film was stacked on the adhesive layer and bonded thereto at 130° C. under a pressure of 1 kg/cm².

Thereafter, the above protection film was peeled off, and a 1 oz/ft² electrolytic copper foil having a thickness of 35 to 40 μm was stacked on the adhesive layer. Then, the so-prepared laminate was consecutively heated at 60° C. for 6 hours, at 80° C. for 6 hours, and at 150° C. for 5 hours to cure the adhesive layer, whereby a cured-adhesive tape was obtained.

EXAMPLE 8

Example 7 was repeated except that the adhesive layer-forming coating composition was replaced with a coating composition containing the following components.

Solution of 25% of a polyamide resin (Tohmide

| | |
|---|---|
| Solution of 25% of a polyamide resin (Tohmide TXC-232-C, supplied by Fuji Kasei Kogyo K.K.) in an isopropyl alcohol/water mixed solvent | 50 parts |
| Solution of 20% of a maleimide compound (N,N'-m-phenylenebismaleimide, BMI-MP, supplied by Mitsui Toatsu Chemicals, Inc.) in N,N'-dimethylacetamide | 15 parts |
| Epoxy resin (Epikote 828, supplied by Yuka Shell Epoxy K.K.) | 13 parts |
| Solution of 50% of a novolak phenolic resin (Tamanol 752, supplied by Arakawa Chemical Industries, Ltd.) in methyl ethyl ketone | 13 parts |
| Solution of 1% of 2-ethylimidazole in methyl ethyl ketone | 15 parts |

Comparative Example 4

Example 7 was repeated except that the adhesive layer-forming coating composition was replaced with a coating composition containing the following components.

| | |
|---|---|
| Solution of 25% of a polyamide resin (Tohmide TXC-232-C, supplied by Fuji Kasei Kogyo K.K.) in an isopropyl alcohol/water mixed solvent | 50 parts |
| Epoxy resin (Epikote 828, supplied by Yuka Shell Epoxy K.K.) | 15 parts |
| Solution of 50% of a novolak phenolic resin (Tamanol 752, supplied by Arakawa Chemical Industries, Ltd.) in methyl ethyl ketone | 15 parts |
| Solution of 1% of 2-ethylimidazole in methyl ethyl ketone | 15 parts |

The cured-adhesive tapes obtained in Examples 7 and 8 and Comparative Example 4 were formed in TAB tapes in the same manner as in Example 5, and the resultant tapes were measured for property values (chemical resistance and adhesion under heat) in the same manner as in Example 5.

TABLE 6

| | Pattern width | 100 $\mu$m | 50 $\mu$m | 35 $\mu$m |
|---|---|---|---|---|
| Example 7 | After etching | 15.2 g | 7.6 g | 3.9 g |
| | After plating | 14.5 | 7.1 | 3.2 |
| Example 8 | After etching | 14.9 | 7.3 | 3.3 |
| | after plating | 14.2 | 6.8 | 3.0 |

TABLE 6-continued

| | Pattern width | 100 $\mu$m | 50 $\mu$m | 35 $\mu$m |
|---|---|---|---|---|
| Comparative | After etching | 9.7 | 5.3 | 2.5 |
| Example 4 | After plating | 8.6 | 4.6 | 1.9 |

TABLE 7

| | Peel strength (g/cm) |
|---|---|
| Example 7 | 180 |
| Example 8 | 175 |
| Comparative Example 4 | 90 |

Tables 6 and 7 clearly show that the adhesive tape for TAB, provided by the present invention, exhibits excellent chemical resistance and excellent adhesion under heat.

What is claimed is:

1. An adhesive tape for tape automated bonding (TAB) having an organic insulating film, an adhesive layer formed on the organic insulating film and a protective layer formed on the adhesive layer, said adhesive layer being a layer containing a polyamide resin having an amine value of at least 3 and a powdery inorganic filler having an average particle size of 0.1 to 3.0 $\mu$m and being at least one oxide selected from the group consisting of silica, alumina, diatomaceous earth, titanium oxide, zinc oxide and magnesium oxide.

2. An adhesive tape for TAB according to claim 1, wherein the adhesive layer contains 1 to 90% by weight of the powdery inorganic filler.

3. An adhesive tape for TAB according to claim 1, wherein the polyamide resin has a weight average molecular weight of 30,000 to 150,000 and a softening point of 100 to 180° C.

4. An adhesive tape for TAB according to claim 1, wherein the adhesive layer further contains 5 to 60 parts by weight, per 100 parts by weight of the polyamide resin, of a phenolic resin.

5. An adhesive tape for TAB according to claim 1, wherein the adhesive layer further contains 9 to 88 parts by weight, per 100 parts by weight of the polyamide resin, of an epoxy resin.

6. An adhesive tape for TAB according to claim 5, wherein the adhesive layer further contains 0.03 to 10 parts by weight, per 100 parts by weight of the epoxy resin, of an imidazole compound.

* * * * *